United States Patent [19]

Fujiyama et al.

[11] Patent Number: 4,529,474

[45] Date of Patent: Jul. 16, 1985

[54] METHOD OF CLEANING APPARATUS FOR FORMING DEPOSITED FILM

[75] Inventors: Yasutomo Fujiyama, Kawasaki; Osamu Kamiya, Machida, both of Japan

[73] Assignee: Canon Kabushiki Kaisha, Tokyo, Japan

[21] Appl. No.: 574,989

[22] Filed: Jan. 30, 1984

[30] Foreign Application Priority Data

Feb. 1, 1983 [JP] Japan .................................. 58/13744

[51] Int. Cl.$^3$ ........................ B44C 1/22; C03C 15/00; C03C 25/06
[52] U.S. Cl. ................... 156/643; 118/50.1; 118/670; 118/715; 156/345; 156/646; 204/192 E; 204/298; 427/38
[58] Field of Search ...................... 156/345, 643, 646; 204/164, 192 EC, 192 E, 298; 427/38, 39, 93, 95; 118/50, 50.1, 620, 715, 728; 252/79.2; 134/1

[56] References Cited

U.S. PATENT DOCUMENTS 4,138,306  2/1979  Niwa .................................. 156/345

Primary Examiner—William A. Powell
Attorney, Agent, or Firm—Fitzpatrick, Cella, Harper & Scinto

[57] ABSTRACT

A method of cleaning an apparatus for forming deposited film on a substrate to remove the substances attached to the inside walls of a reaction chamber in the course of the formation of deposited film on the substrate by etching with plasma reaction comprises using a gas mixture of carbon tetrafluoride and oxygen as etchant.

3 Claims, 3 Drawing Figures

METHOD OF CLEANING APPARATUS FOR FORMING DEPOSITED FILM

BACKGROUND OF THE INVENTION

1. Field of the Invention

This invention relates to a method of cleaning an apparatus for forming deposited film by plasma CVD process, a thermal CVD process or the like, which are hereinafter generically referred to as "chemical vapor deposition" (CVD) process.

2. Description of the Prior Art

Techniques for forming a functional film on a substrate according to the CVD process have been already widely used, for example, for uniformly forming film of photoconductive member on a drum in electrophotography. When a film is formed by the CVD process, a part of the reaction product is inevitably attached to surfaces other than the substrate to be coated, for example, the surfaces of the inside walls of the reaction chamber, etc. in the form of film or powder. Such film and power attached to the inside walls will be easily peeled or dropped off. The powder dropped off floats and travels in the reaction chamber and then may adhere to the surface of the substrate to be coated with the deposited film, thereby causing defects of the film such as pin-holes. In order to prevent such defects, each time film formation is completed, it is necessary to demount the reaction chamber from the apparatus and then to remove the film and the powder attached to the inside walls by a physical or chemical method, for example, by immersing the reaction chamber in a solution containing hydrofluoric acid or the like to dissolve the attached substances. Then the reaction chamber is washed with pure water and the like and dried. Thereafter the reaction chamber is mounted on the apparatus again. The apparatus must be checked for air tightness and electrical contact before use. A series of procedures described above is extremely complicated. This causes lot to lot variation of the quality of the deposited film formed on the substrate, especially in the case of electrophotographic photosensitive member of amorphous silicon (which is, hereinafter, referred to as "a-Si").

It is difficult to automate the above washing step because the whole step must be inevitably conducted manually by operators. The larger apparatus for mass production is associated with larger equipment required for the washing step. Such drawbacks make difficult mass production of the film a-Si electrophotographic photosensitive members.

There has been known in the prior art a method of cleaning the reaction chamber by etching the inside walls thereof by use of nitrogen fluoride or ammonium fluoride as an etchant. However, in this case, silicon nitride ($Si_3N_4$) forms on the surface of the inside walls in the course of etching step and covers the surface to be etched to reduce the etching rate.

There has been also known a method using a chloric compound as an etchant. In this case, impurities such as chlorine, etc. may be entrained in the silicic compound film formed in the reaction chamber after cleaning to considerably lower the film characteristics.

According to another method, hydrogen ($H_2$) containing carbon tetrafluoride is used as an etchant. In this case, a polymer of $CF_2$ monomer is produced and deposited on the surface to be etched. The deposition rate of the polymer may exceed the etching rate to spoil the etching effect.

SUMMARY OF THE INVENTION

An object of the present invention is to provide a novel method which can clean the inside walls of the reaction chamber, etc. by removing the substances attached to the inside walls in the course of the formation of the deposited film on a substrate without demounting the reaction chamber from the apparatus and which overcomes the drawbacks of the prior arts described above.

According to the present invention, there is provided a method of cleaning an apparatus for forming deposited film on a substrate to remove the substances attached to the inside walls of the reaction chamber in the course of the formation of deposited film on the substrate by etching with a plasma reaction, which comprises using a gas mixture of carbon tetrafluoride and oxygen as etchant.

DESCRIPTION OF THE PREFERRED EMBODIMENT

The present invention is described below with reference to the drawings.

Figure 1:
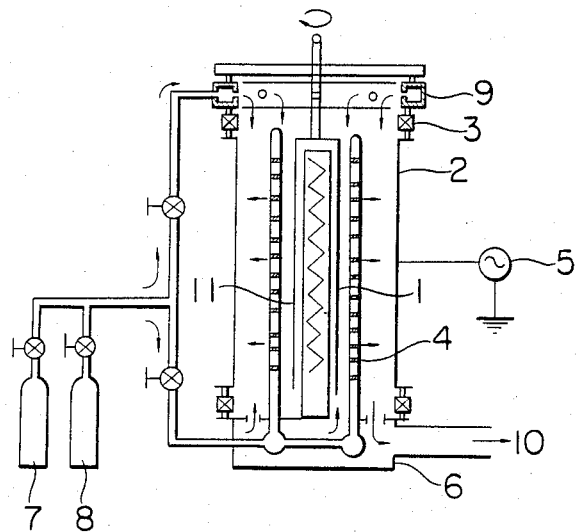
FIG. 1 schematically illustrates an example of a reaction apparatus for practicing the method of the present invention.

FIG. 1 schematically illustrates an apparatus used for forming a-Si film on a substrate by a CVD process. A cylindrical anode 1 also serves as a substrate, and 2 is a cylindrical cathod. Silane gas from a starting gas tank 7 is emitted through a starting gas emitting tube 4 into a reaction chamber evacuated by an evacuating system 10. Then plasma is generated between the electrodes by use of a high frequency power source 5, and a-Si film is formed on the substrate by the action of the plasma in accordance with the CVD process. In the course of the formation of the deposited film on the substrate, a part of the reaction product is inevitably attached to the inside walls of the reaction chamber, etc. In carrying out the method of the invention, the substrate is removed from the position indicated in FIG. 1 to the outside of the reaction chamber by a substrate removing means (not shown) while maintaining the vacuum state in the reaction chamber, and instead a new dummy anode is introduced into the position indicated by a substrate introducing means (not shown). After a gas mixture of carbon tetrafluoride and oxygen in a gas mixture container 8 is introduced into the reaction chamber through an etching gas emitting ring 9, plasma is generated by means of the high frequency power source 5. Polysilanes attached to the inside wall of the reaction chamber, etc. are etched with fluorine radical particles formed through the plasma reaction of the gas mixture to form gases of silicon tetrafluoride ($SiF_4$) and the like, which are then discharged out of the vacuum tank by the evacuation system 10. Thus cleaning of the inside walls of the reaction chamber etc. is completed.

Figure 2:
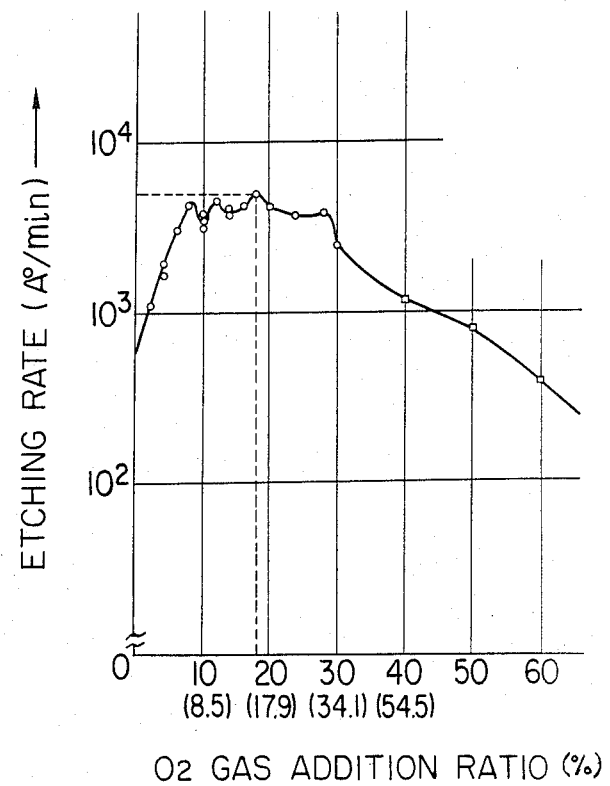
FIG. 2 illustrates the reaction between the a-Si film etching rate and the ratio of oxygen gas added to carbon tetrafluoride gas (gas flow rate ratio). In the figure, numerical values in parentheses along the abscissa indicate measured ratios of the partial pressures of the gases ($O_2/CF_4$) in percentage.

FIG. 2 illustrates the relation between the etching rate of a-Si film and the ratio of oxygen added to carbon tetrafluoride when the method of the present invention was carried out by use of the apparatus described above. In this experiment, etching properties of the gas mixture were determined for a-Si film formed on an anode in the reaction chamber where no polysilane is attached to the inside walls thereof. The experiment was carried out under the conditions of a flow rate of the gas mixture of 500 cc/min., an inner pressure during the reaction of 0.35 Torr, and a high frequency power of 500 watt. In this case, an etching gas was fed into the reaction chamber by means of the starting gas emitting tube 4. As shown in FIG. 2, when no oxygen was added, the rate of etching a-Si film was 540 Å/min. However, when oxygen gas was added at a gas flow rate ratio ($O_2/CF_4$) of 8 to 28%, i.e., at a partial pressure ratio ($O_2/CF_4$) of about 8 to 30%, the etching rate increased up to 3000 to 5000 Å/min. Especially, in the case of the gas mixture with an oxygen addition ratio of 18%, an etching rate of 5000 Å/min. was obtained.

Referring now to the following Examples, the present invention is further described.

EXAMPLES

By use of the apparatus of FIG. 1, the polysilane film formed on the inside walls of the reaction chamber in the course of the formation of a-Si film on a substrate by a CVD process was removed by etching. As an etching gas, a gas mixture of carbon tetrafluoride and oxygen with an oxygen addition ratio of 18% was used. Etching by plasma reaction was carried out at a flow rate of the gas mixture of 1000 cc/min. and a high frequency power of 1000 watt. As the result, the polysilane film on the inside walls of the reaction chamber could be removed at an etching rate of about 2500 Å/min.

Etching was carried out in the same manner as in the above example except that the flow rate of the gas mixture was reduced to 500 cc/min. In this case, although the etching rate decreased to about 1600 Å/min., the plasma discharging region was observed to be expanded due to the reduction of the inner pressure during the reaction and therefore it was confirmed that the effect of etching polysilanes extended to the inside walls of members other than the reaction chamber such as gas feeding means in the vacuum tank. It was also confirmed that long life neutral fluorine radical particles could etch and remove polysilanes attached to the inside walls of stainless tubes of vacuum evacuating system and blades in a mechanical booster pump. This means that the method of the invention has the advantage of extending the period between maintenance operations for the evacuating system, which maintenance operations have been a problem in the plasma CVD processes for producing a-Si film. In addition, the effect of removing the attached substances by etching could be achieved without intentional heating or cooling of the evacuating system.

Figure 3:
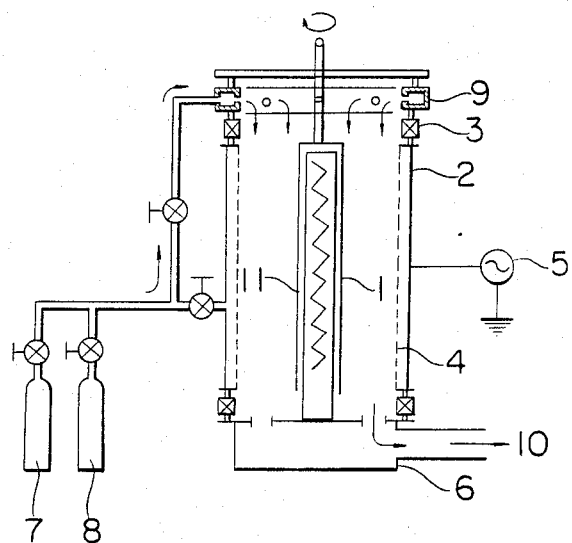
FIG. 3 schematically illustrates another example of a reaction apparatus for practicing the method of the present invention.

FIG. 3 schematically illustrates another apparatus for practicing the method of the invention.

As a starting gas emitting means, in place of the quartz tube with gas emitting holes used in the apparatus shown in FIG. 1, the apparatus in FIG. 3 has a cylindrical cathode 2 with a hollow double structure partially constituted of an inner wall and an outer wall. The material gas fed into the hollow part is emitted through gas emitting holes 4 provided through the inner wall into the reaction chamber. This constitution can improve the drawback that the surface of the quartz tube is also etched in the course of the cleaning of the reaction chamber, etc. to be reduced in tube thickness and become fragile.

In the case of using the apparatus in FIG. 3, the starting gas feeding system and the etching gas feeding system to be employed may be also chose as desired depending on the purpose.

As described above, according to the method of the present invention, powder and film of silicic compounds such as polysilanes attached to the inside walls of the reaction chamber can be removed by etching them with plasma from the gas mixture of carbon tetrafluoride and oxygen without bringing the reaction chamber back to the atmospheric pressure and demounting it from the vacuum tank. Thus the method of the invention can automate the step of cleaning the reaction chamber, etc. which has been inevitably conducted manually by operators.

In addition, since the method of the present invention makes it unnecessary to assemble or to disassemble the reaction chamber, etc. when they are cleaned, the conditions in the reaction chamber may be constantly retained. This provides the advantages that the lot-to-lot variation of products such as a-Si photosensitive member is reduced and the yield of products is improved.

Further, partly because similar conventional film forming techniques are available for the method of the present invention, and also because etching can be controlled easily and stably, the present technique can be introduced into mass production apparatuses.

The end point of etching can be detected by a plasma spectroanalyzer, thus enabling automatic stopping of cleaning.

We claim:

1. A method of cleaning an apparatus for forming deposited film on a substrate to remove the substances attached to the inside walls of a reaction chamber in the course of the formation of deposited film on the substrate by etching with plasma reaction, which comprises using a gas mixture of carbon tetrafluoride and oxygen as ethant, wherein the partial pressure ratio of ($O_2/CF_4$) in said gas mixture is 8 to 30%.

2. A method according to claim 1 wherein said gas mixture is introduced into the apparatus from a gas emitting inlet disposed on the inside of the end of the apparatus opposite to an evacuating outlet.

3. A method according to claim 1 wherein the region to be cleaned is controlled by changing the vacuum degree in the reaction chamber when said gas mixture is introduced into the reaction chamber.

* * * * *